United States Patent [19]

Anders

[11] 4,058,445
[45] Nov. 15, 1977

[54] METHOD OF PRODUCING A TANTALUM THIN FILM CAPACITOR

[75] Inventor: Wilfried Anders, Munich, Germany

[73] Assignee: Siemens Aktiengesellschaft, Munich, Germany

[21] Appl. No.: 670,827

[22] Filed: Mar. 26, 1976

[30] Foreign Application Priority Data

Mar. 27, 1975 Germany .............................. 2513858

[51] Int. Cl.² ........................ C23C 15/00; H01G 4/10
[52] U.S. Cl. ............................. 204/192 SP; 29/25.42; 204/37 R; 204/38 A; 361/305; 427/79; 427/80
[58] Field of Search ................. 75/.5 BB; 148/11.5 R; 317/258; 427/79, 80; 204/38 A, 192 SP, 192 FR, 37 R; 29/25.42

[56] References Cited

U.S. PATENT DOCUMENTS

| | | | |
|---|---|---|---|
| 3,275,915 | 9/1966 | Harendza-Harinxma | 204/192 SP |
| 3,544,434 | 12/1970 | Giller et al. | 204/192 SP |
| 3,607,679 | 9/1971 | Melroy et al. | 204/192 SP |
| 3,664,931 | 5/1972 | Gerstenberg | 204/192 SP |
| 3,718,565 | 2/1973 | Pelletier | 427/79 |
| 3,723,838 | 3/1973 | Kumagai | 204/192 SP |

*Primary Examiner*—W. Stallard
*Attorney, Agent, or Firm*—Schuyler, Birch, Swindler, McKie & Beckett

[57] ABSTRACT

A method of producing thin film tantalum capacitors having a tantalum thin film electrode mounted on a nonconducting support member is described. The tantalum electrode is doped with nitrogen to produce a nitrogen content in a range from the nitrogen content of β tantalum to that for tantalum nitride. A tantalum pentoxide film with dielectric properties is grown on the tantlum electrode by oxidation. At least, the tantalum electrode and the dielectric are subjected to tempering. The dielectric is then covered with another electrode.

4 Claims, 6 Drawing Figures

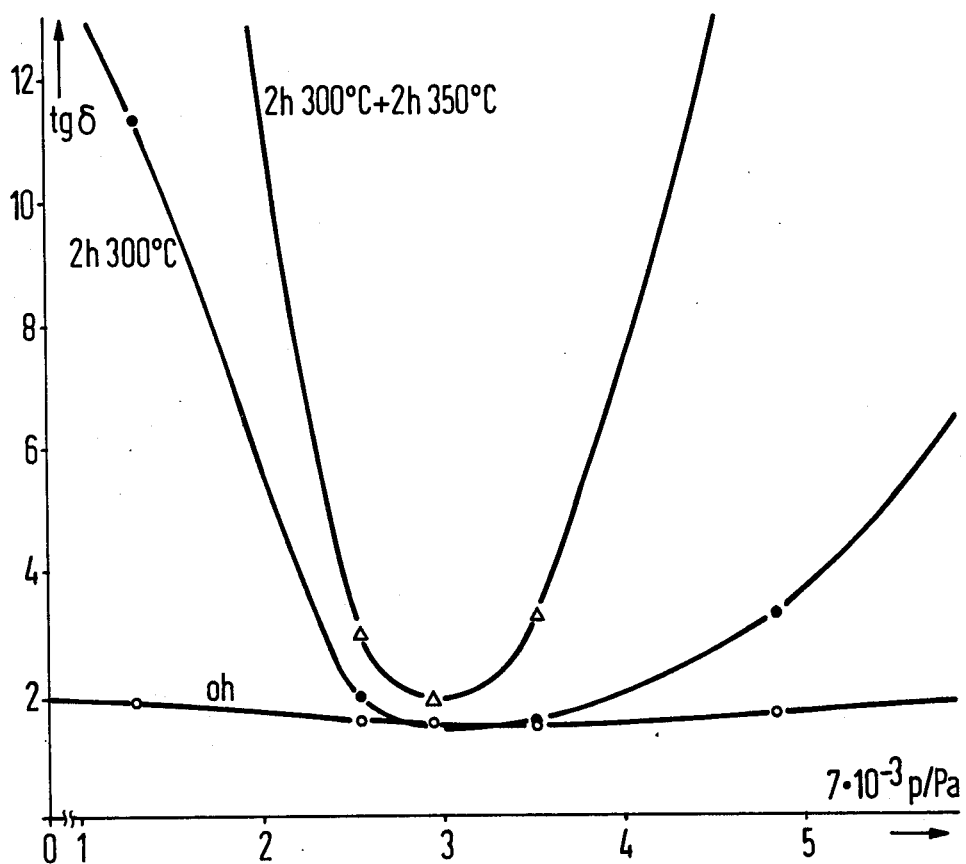

METHOD OF PRODUCING A TANTALUM THIN FILM CAPACITOR

BACKGROUND OF THE INVENTION

This invention relates in general to a method of producing a thin film capacitor having a tantalum thin film electrode mounted on an electrically nonconducting support.

A thin film capacitor has become known (West German Offenlegenschrift 1,589,060) wherein a film of β-tantalum is deposited on a hard-glass plate. The film forms the base electrode to which are connected a dielectric of tantalum pentoxide ($Ta_2O_5$) and an opposing electrode of gold.

Experiments have shown (J. Electrochem. Society, Vol. 119, No. 9, page 1215 ff, Schoen) that these capacitors have only a low thermal rating. The characteristics relevant to capacitors such as capacitance (C), temperature coefficient of the capacitance ($C_c$) and leakage (tan δ) increase appreciably with heating, more particularly at temperatures above 200° C. However, new technological processes such as inexpensive dip soldering for contact making cannot be employed for these capacitors, since any momentary heating to high temperatures must be avoided. Furthermore, artifical aging at a sufficiently high temperature so as to achieve an ideal life characteristic is not possible.

A method is likewise known using tantalum nitride ($Ta_2N$) for the base electrode of such capacitors (Gerstenberg, Journal of the Electrochemical Society, June 1966, page 542 ff). These experiments show that with $Ta_2N$ as primary material and increasing the temperature (110° C) or the voltage (≦ 750 volts in the case of a 225 volt anodizing voltage) the durability of the capacitor is better than that of a β-tantalum capacitor.

Accordingly, it is an object of this invention to provide a method of production which will have the effect of improving the characteristic properties of thin film capacitors in such a way that the capacitors can be used in a wide range of applications, where they will experience a wide range of ambient conditions.

SUMMARY OF THE INVENTION

These and other objects of this invention are achieved in a method of production wherein the thin film electrode of tantalum mentioned at the start of this application is doped with nitrogen. The thin film electrode and at least the film having the dielectric properties are both subjected to tempering, whereby the nitrogen content lies in a range with a lower limit higher than that of β-tantalum and an upper limit lower than that of tantalum nitride.

Admixture of a portion of nitrogen lying in the aforementioned range to the base material of tantalum, preferably performed through reactive cathode sputtering, and subsequent tempering produces a number of surprising advantages which are discussed in the following.

The long-term stability essential for the common use of capacitors of this type is improved. Moreover, dielectric leakage is reduced. Thus, in one example values of tan δ = 1.5 · $10^{-3}$ (with $f$ = 1 kHz, 10 nF and ambient temperature) are achieved. Technological processes implying capacitor stability now possible. In particular, inexpensive contact formation of the opposing electrode by dip soldering. The specific resistance of the tantalum electrode is substantially reduced. Values of 100 μΩ cm are achieved (comparable β-tantalum values lie in a range between 150 and 200 μΩ cm). Hence it follows that the capacitor exhibits smaller leakages at higher frequencies, which results in the extension of the range of applications. Finally, the temperature coefficient of the capacitance ($C_c$) is lowered from about 200 ppm/C (β-tantalum) to about 140 ppm/C, this simplifying the production of temperature compensation RC networks.

Another considerable advantage is the fact that the variation of capacitance during the heat treatment rapidly approaches a limiting value so that in contradistinction to known tantalum thin film capacitors the length of the tempering period has no effect on the capacitance, since a definite value appears for the capacitance in the case of indefinitely long tempering periods.

Another advantage arises out of the fact that the nitrogen content of the material employed as base material in accordance with this invention lies comparatively closer to the nitrogen content for the tantalum nitride generally used for resistors than the nitrogen content of β-tantalum. Thus, it is possible without special provision to place RC networks on a single substrate, whereby in this case the resistor and capacitor films may be deposited directly one after another.

BRIEF DESCRIPTION OF THE DRAWINGS

The principles of the invention will be more readily understood by the description of a preferred form of execution of it given hereinbelow in conjunction with the drawings which are briefly described below.

FIG. 6 is a graph illustrating changes in the loss factor of the FIG. 1 embodiment as a function of the $N_2$ partial pressure with different heat treatments.

DETAILED DESCRIPTION OF THE DRAWINGS

Figure 1:
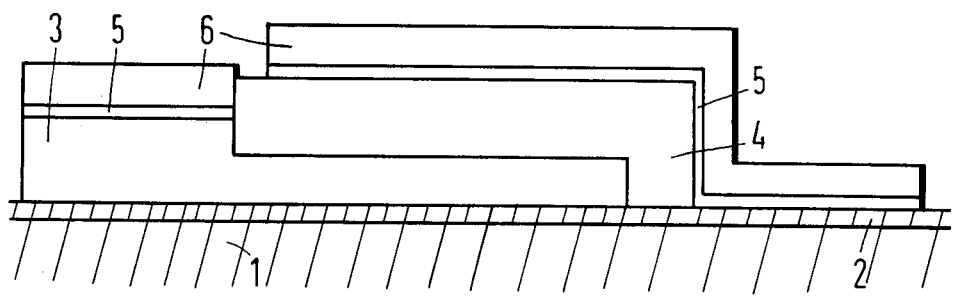
FIG. 1 is a side, partially sectioned view of a tantalum thin film capacitor constructed in accordance with the method of the invention.
Figure 2:
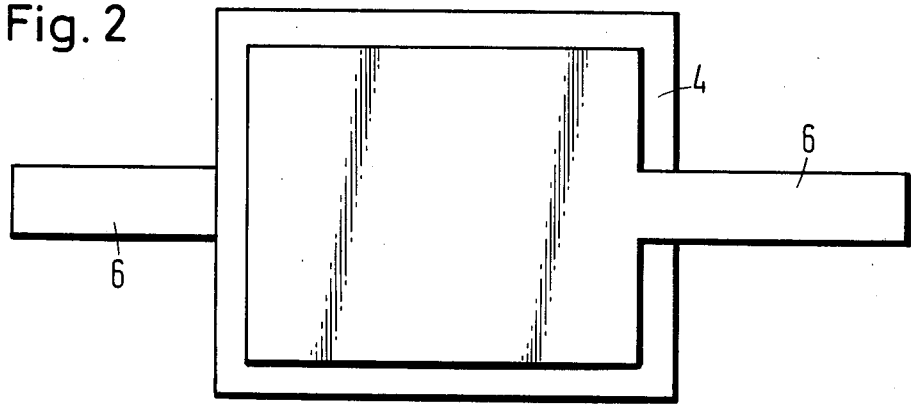
FIG. 2 is a top view of the FIG. 1 embodiment.

In the following description the method of producing a tantalum thin film capacitor in accordance with the invention shall be discussed with reference to the embodiment shown in FIGS. 1 and 2 illustrating the film structure of the capacitor.

A substrate 1 of insulating material, e.g., glass or quartz, serves as base material, which substrate is provided with a film 2 of about 50 nanometer tantalum pentoxide ($Ta_2O_5$) used as an etching guide or mask, upon which a 500 nanometer thick α-tantalum film is sprayed in a high-frequency sputtering machine at a rate of about 12 nanometers per minute. In the apparatus employed, for example, the high-frequency output is 550 watts in the case of self-bias voltage in the 2.5 kilovolt range on the tantalum cathode (target) at an argon pressure of 2.7 · $10^{-1} p_a$ (2 · $10^{-3}$ torrs). Optimum values (minimum for tan δ) are achieved at a partial nitrogen pressure of $3 \cdot 10^{-3} p_a$ ($2.3 \cdot 10^{-5}$ torrs) (FIG. 6), the specific resistance $\rho$ of the tantalum being preferably 100 $\mu\Omega \cdot$ cm and the temperature coefficient of the $\rho$ about 350 ppm/C.

The normal reproduction and etching techniques are applied for structuring the films.

Film 4 having dielectric properties is then produced by anodic oxidation at ambient temperature in 0.01 percent citric acid with a current density of from 200Ω to 230 volts with a reforming period of about 1.5 hours. For the opposing electrode, a film 5 of 25 nanometers nickel chromium or 25 nanometers chromium and 250 nanometers gold is sprayed. Film 5 serves as an adhesive layer for film 6 consisting of gold deposited as a 250 nanometer thick layer.

The tempering of the completed capacitor is performed for two hours in air at a temperature of about 250° C.

Figure 3:
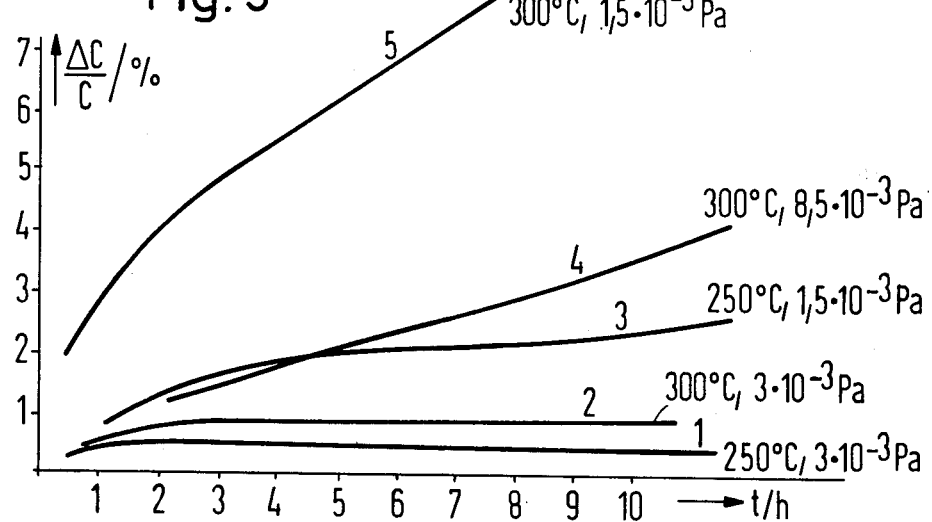
FIG. 3 is a graph illustrating change in capacitance at ambient temperature of the FIG. 1 embodiment as a function of tempering time with varying $N_2$ partial pressures.
Figure 4:
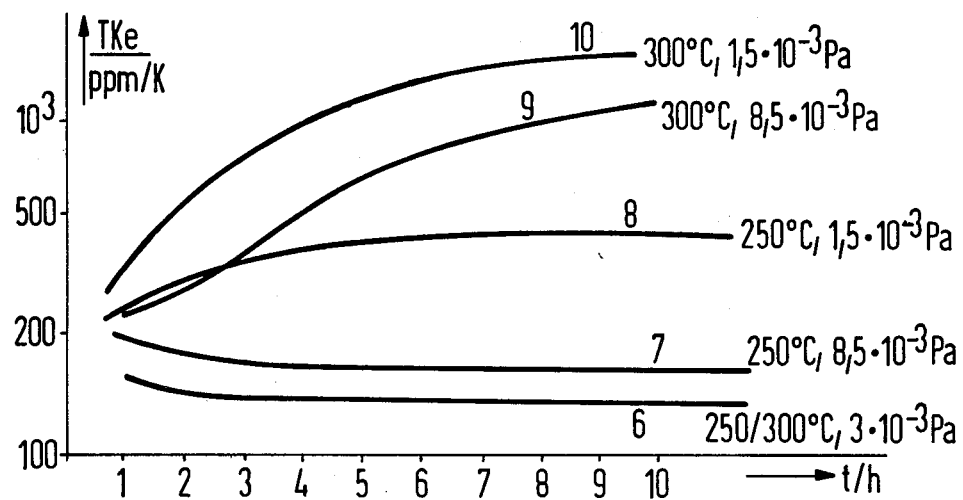
FIG. 4 is a graph illustrating variation in temperature coefficient of capacitance of the FIG. 1 embodiment as a function of tempering time with varying $N_2$ partial pressures.
Figure 5:
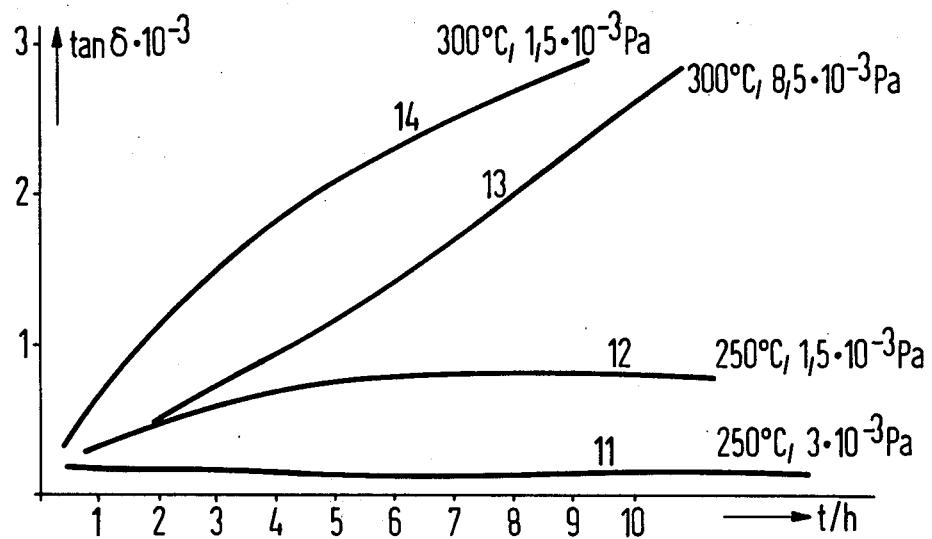
FIG. 5 is a graph illustrating changes in the loss factor of the FIG. 1 embodiment as a function of tempering time with varying $N_2$ partial pressures.

The test results of such capacitors are shown in FIGS. 3, 4 and 5.

FIG. 3 shows the variation of capacitance $\Delta C/C$ at ambient temperature, FIG. 4 shows the temperature coefficient $TC_c$ and FIG. 5 the loss factor at ambient temperature. Each curve is plotted as a function of the tempering time $t$ at various $N_2$ partial pressures. As parameters are chosen the temperatures (250° C and 300° C) and the $N_2$ partial pressure prior to spraying (1.5 $\cdot 10^{-3} p_a$, $3 \cdot 10^{-3} p_a$ and $8.5 \cdot 10^{-3} p_a$) (1 $p_a = 7.5 \cdot 10^{-3}$ torrs). The values of $C_c$ and tan δ at all $N_2$ pressures are substantially the same prior to tempering.

From the test results shown in FIG. 3 it is perfectly clear that the variation of capacitance is 0.5 percent at 250° (curve 1) and 0.85 percent at 300° (curve 2). About 5 hours of tempering at 250° C produces a slight decarbonization ($3 \cdot 10^{-3} p_a$ $N_2$ partial pressure, curve 1).

Curves 3, 4 and 5, on the other hand, show an increasing change of capacitance $\Delta C/C$ with rising tempering time $t$.

It is apparent from FIGS. 4 and 5 that the values of $TC_c$ and tan δ are substantially the same prior to tempering at all $N_2$ partial pressures. However, during tempering the values of $C_c$ and tan δ diverge with the varying $N_2$ charges. A special position is taken by the mean $N_2$ partial pressure wherein at 300° C already after 1 hour for $TC_c$ (curve 6, 7) and tan δ (curve 11, 12) the stable values 140 ppm/C and $1.5 \cdot 10^{-3}$, respectively, are assumed. The behavior of the capacitors at $1.5 \cdot 10^{-3} - p_a$ $N_2$ partial pressures with its strong $TC_c$ (curve 10) and tan δ increment (curve 14) approximately corresponds to the quality of β-tantalum capacitors. A non-uniform behavior is shown by the capacitors having a high nitrogen content. At 250° C a stable state (curve 7, 11) is observed after about 5 hours, while at 300° C (curve 10, 13) the values vary as much as in the case of too little $N_2$ partial pressure.

The test results shown in FIG. 6 show the loss factor tan δ as a function of the $N_2$ partial pressure after different heat treatment. This results in optimum $N_2$ partial pressure of about $3 \cdot 10^{-3} P_a$. Even after tempering at 350° for 2 hours the loss factor in the case of optimum $N_2$ content is low and almost unaltered. In the case of tan δ the minima are sufficiently flat, thus ensuring a sufficiently correct reproducibility from the production.

The method of the invention is described hereinabove by describing a preferred way of carrying it out and a preferred form of construction of the resulting article. It is contemplated that the specifically described method steps, particularly the conditions and parameters used therewith, and the specifically described embodiment can be modified, varied or changed while remaining within the scope of the invention as defined by the appended claims.

I claim:

1. A method for producing heat-stable, dip-solderable thin film tantalum capacitors comprising the steps of:
    mounting a thin film alpha tantalum electrode on a non-conducting supporting member, the tantalum being doped with nitrogen so as to have a minimum nitrogen content greater than the nitrogen content of beta tantalum and a maximum nitrogen content less than that of tantalum nitride,
    forming a tantalum pentoxide film having dielectric properties on said tantalum electrode,
    tempering at least the tantalum electrode and the dielectric film and
    covering said dielectric film with another electrode of a film conducting material.

2. The method defined in claim 1 wherein said other electrode is of a material selected from a group consisting of nickel, chromium and iron.

3. The method defined in claim 1 wherein said tempering step is performed subsequent to said forming and covering steps.

4. The method defined in claim 1 wherein said tempering step is performed for a 2 hour period in atmospheric air at a temperature of 250° C.

* * * * *